United States Patent [19]

Barbour

[11] Patent Number: 5,812,064
[45] Date of Patent: Sep. 22, 1998

[54] MEDICINE CONTAINER WITH VOICE SOUND CONVEYOR

[75] Inventor: William P. Barbour, Rocky Mount, Va.

[73] Assignee: NewBold Corporation, Rocky Mount, Va.

[21] Appl. No.: 292,186

[22] Filed: Aug. 18, 1994

[51] Int. Cl.⁶ .................................................. G06F 7/04
[52] U.S. Cl. ...................................................... 340/825.35
[58] Field of Search .................................... 128/903, 904; 221/2, 3, 15; 340/825.35, 533, 573, 309.4, 309.15, 692, 825.19; 364/705.01; 368/10

[56] References Cited

U.S. PATENT DOCUMENTS

| | | | |
|---|---|---|---|
| 4,361,408 | 11/1982 | Wirtschafter | 221/2 |
| 4,382,688 | 5/1983 | Machamer | 221/2 |
| 4,473,884 | 9/1984 | Behl | 221/3 |
| 4,504,153 | 3/1985 | Schollmeyer et al. | |
| 4,682,299 | 7/1987 | McIntosh et al. | 340/309.4 |
| 4,831,562 | 5/1989 | McIntosh et al. | |
| 4,962,491 | 10/1990 | Schaeffer | 221/15 |
| 5,063,698 | 11/1991 | Johnson et al. | |
| 5,152,422 | 10/1992 | Springer | |
| 5,181,189 | 1/1993 | Hafuer | 221/2 |
| 5,239,491 | 8/1993 | Mucciacciaro | |
| 5,291,191 | 3/1994 | Moore | 340/825.35 |
| 5,358,483 | 10/1994 | Sibalis | |

OTHER PUBLICATIONS

Damark Product Catalog; "Electronics Direct"; pp. 16, 20–21, 25; Apr. 18, 1994 Edition; Damark International, Inc. Minneapolis MN 55429; USA, Apr. 18, 1995.

*Primary Examiner*—Mark H. Rinehart
*Attorney, Agent, or Firm*—Birch, Stewart, Kolasch & Birch, LLP

[57] ABSTRACT

Medicine containers are provided with a sound capsule which aids those who are visually impaired to receive instructional information concerning the medicine. The medicine vial or pill bottle is fitted with a housing containing a chip (EEPROM) which is encoded with identifying information by the pharmacist after the bottle is filled. At home the patient has a playback unit with a loud speaker into which the chip housing which serves as a sound conveyor, is placed. Synthetic voice instruction based on the information recorded on the chip is supplied to the loud speaker to assist the reading impaired person.

10 Claims, 5 Drawing Sheets

BROADCAST UNIT

MEDICINE CONTAINER WITH VOICE SOUND CONVEYOR

BACKGROUND OF INVENTION

1. Technical Field

This invention relates to apparatus and methods for aiding blind, sight impaired and those who cannot read to identify the contents of a medicine container by means of synthetic voice instruction that is electronically stored in a prescription bottle at the time the prescription is filled.

2. Description of Prior Art

Medication bottles have been specially designed to aid patients or medication users to remember when to take medications. A variety of machines and devices have been devised which aid in controlling the time intervals between dosages. Some packages have gone so far as to provide lockable closures and multiple dispensing means. Representative efforts are disclosed in U.S. Pat. No. 4,831,562 to McIntosh et al. for Medication Clock; U.S. Pat. No. 4,504, 153 to Schollmeyer et al. for Pharmacist-Programmable Medication System and Method; U.S. Pat. No. 5,152,422 to Springer for Medication Dispenser; and U.S. Pat. No. 5,239, 491 to Mucciacciaro for Medication Reminder With Pill Containers dolder etc. These system are focused on timing or dispensing and are overly complex and too expensive to allow them to be used by people at the lower end of our income levels.

Accordingly, one object of this invention wherein the blind, illiterate or those who cannot read can receive voice instructions from each drug vial or bottle in his possession, indicating for whom the drug has been prescribed as well what the drug is, how often it can be taken, and any side effects it might create. It is recognized that those people thus afflicted are many times taking a large variety of medication, and therefore the "talking" pill bottle or vial must be the cheapest part of the system. It is therefore another object of the invention to make the audible container system so simple to use that the visually handicapped will adjust to it with little or no instruction.

SUMMARY OF THE INVENTION

Production of an audible signal including synthetic speech can be achieved by tapping into the systems now widely used by major drugstores which print out labels and instruction sheets for each individual prescription. A selected segment of the digitized information used to produce printed media is captured in a memory unit housed in the base of the bottle, vial or other container in which the medication has already been placed by the pharmacist. In the interest of versatility, the memory unit may be in the form of a chip that is enclosed in a small enclosure or housing which is attached to the bottom of the bottle or vial of varying sizes or be form as an integral part of such a container.

The medication in its container with the memory unit attached is inserted into a programming unit. Selected data from the information stream flowing from the personal computer of the pharmacist to a label or sheet printer is intercepted and transferred to the memory unit.

The container with its medication and memory unit is transported to the home where a playback unit is located. The playback unit includes a loud speaker, a battery or electrical power cord and circuitry for operating the loud speaker. In the top of the playback unit is an opening into which the bottom of the medication container will easily locate and come to rest. Because of the arrangement of the electrical contacts on the memory unit housing and the playback unit, the need for orienting the bottle relative to the playback unit is eliminated.

Dropping the medication bottle with its memory unit into the playback unit activates the voice circuit. When the message is complete, the playback unit shuts off. Replay of the message is provided merely by reinserting the bottle into the broadcast unit.

DETAILED DESCRIPTION OF PREFERRED EMBODIMENT

Figure 1:
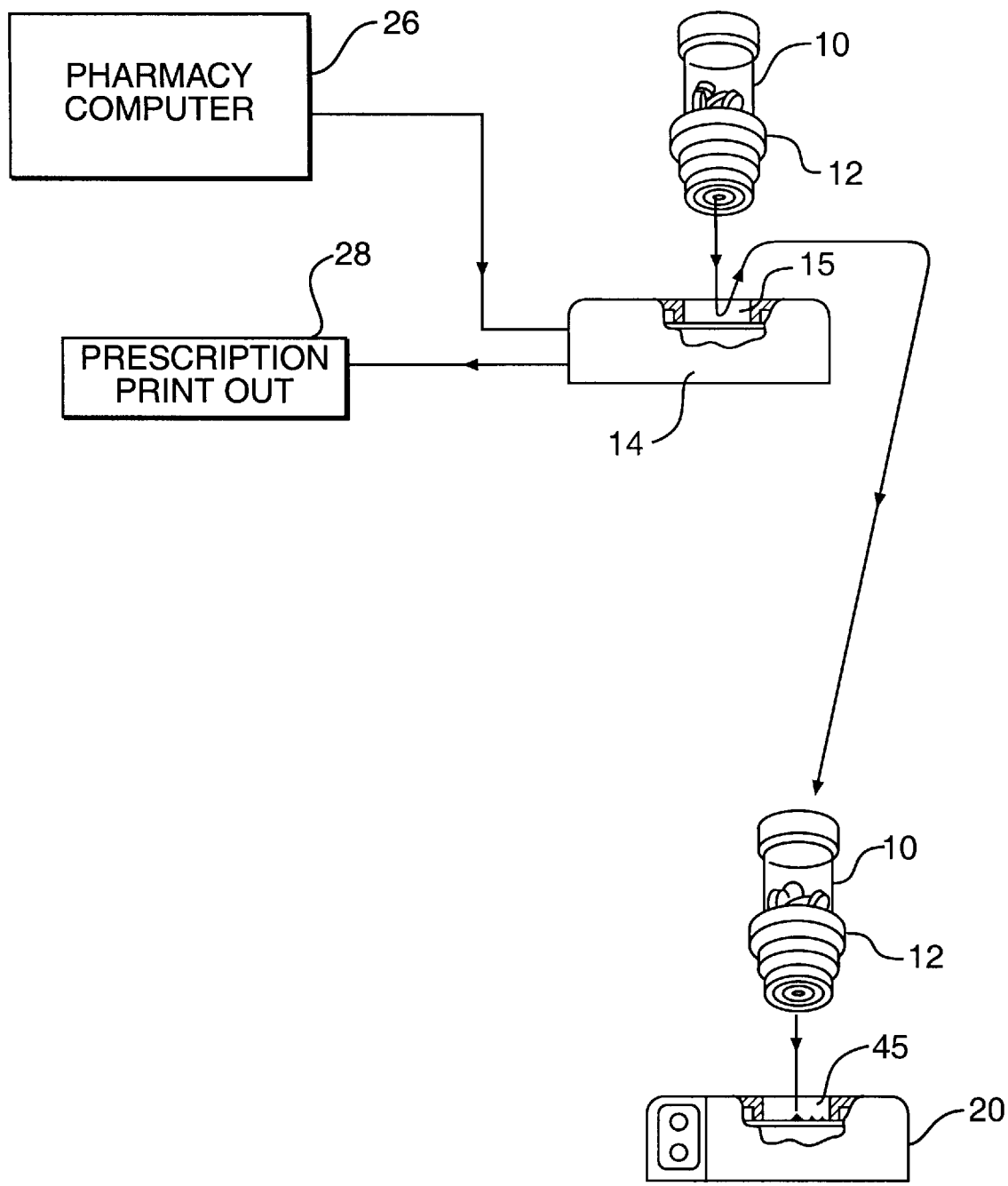
FIG. 1 is a diagrammatic view of the overall system showing the various steps that are involved in the method of the present invention.
Figure 2:
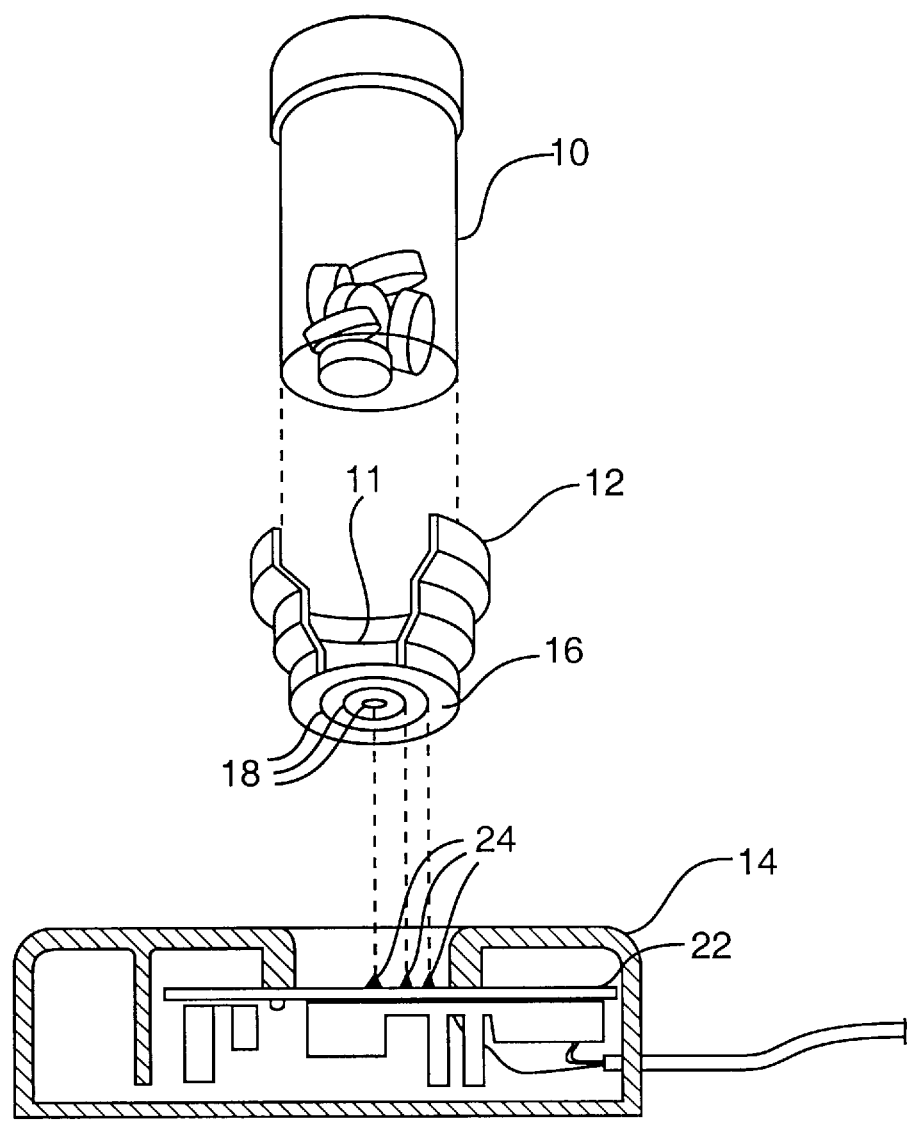
FIG. 2 is an exploded view showing the juxtaposition of parts in the programming unit.

The present invention is diagrammatically illustrated by FIG. 1 wherein a standard pill bottle 10 containing prescription medication in the form of pills is shown above a housing 12 into which the pill bottle is snapped into position. The invention may be used with liquid in vials or with other kinds of containers. The housing 12 may have a stepped wall as best shown in FIG. 2 so that bottles having different diameters may be accommodated and secured by friction or adhesive or otherwise be or become an integral part of the bottle 10.

The pill bottle 10 is placed in the upper open end of housing 12 and covers a chip 11 which may be an EEPROM or other suitable type and which serves as a memory unit that is fitted on the upper side of a lower surface 16. The lower surface 16 carries electrical contacts 18 which may be, for example three concentric rings so that the orientation of bottle 10 is unimportant when the housing 12 is placed in operative association with either the programmer 14 or the loud speaker 20 as by being fitted in the upper open end of programmer unit 14 of FIG. 2 or the loudspeaker unit 20 of FIG. 3.

Programmer unit 14 may have a circuit board 22 having electrical contact points 24 through which information signals are transmitted to the memory unit 11. The system includes a pharmacy computer 26 which may in some installations be connected to a master computer at a central location, not shown, to service a number of retail pharmacy outlets, each of which has its own personal computer (PC) 26 and keyboard for entering data from the prescription sheet provided by the doctor. A printer 28 is also provided at the pharmacy station for the preparation of the usual label including name of drug, dosage and patient's name, and optionally information sheets such as side effects and cautionary statements.

In the FIG. 1 embodiment, the programmer 14 is illustrated as being located between the pharmacy computer 26 and the printer 28 to receive the information that is sent to the printer 28 and thus have available such information as may be desired for storage in the memory unit 11. Other data transmission techniques may be used for transmitting to the programming unit 14 the requisite information concerning the medication supplied in the container 10 such as by connecting the printer and the programmer unit 14 to separate dedicated output ports of the computer 26.

Figure 4:
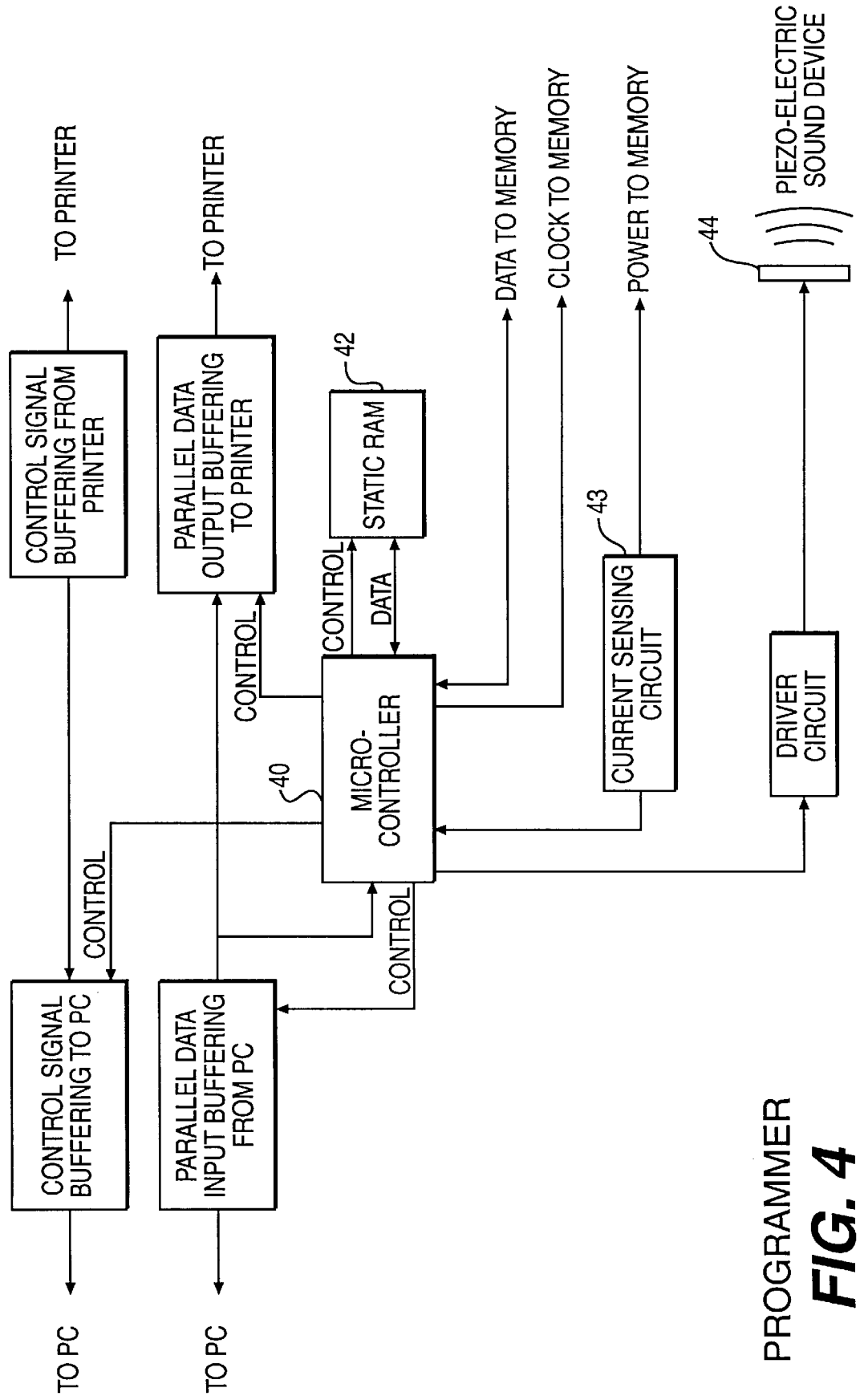
FIG. 4 is a block diagram of the electronics that may be used in the programming unit.

The signals from the computer 26 are transmitted to circuitry in the programmer 14 which is diagrammatically illustrated by FIG. 4. A microcontroller 40 monitors the parallel port from the computer 26 for a correct series of control characters. Preferably the printer 28 is disabled while the information for memory unit 11 is processed. A digital data block from computer 26 is stored by the microcontroller by a static RAM 42. An audible signal (beep comes from a sound generator 44, which may be piezoelectric sound device, to let the operator know to insert the housing 12 with the memory unit 11 into the upper open end of the programming unit 14. The container 10 with the housing 12 in an opening 15 as diagrammatically indicated in FIG. 1 and its proper position detected by current sensing circuit 43. Data is transferred from the static RAM 42 via the microcontroller 40 to the memory unit 11. Data is then read back from memory unit 11 and compared with the data stored in the static RAM 42 for verification. An audible tone is again generated from sound generator 44 to indicate a successful programming of the memory unit 11. The medication container or pill bottle 10 is then removed.

Figure 3:
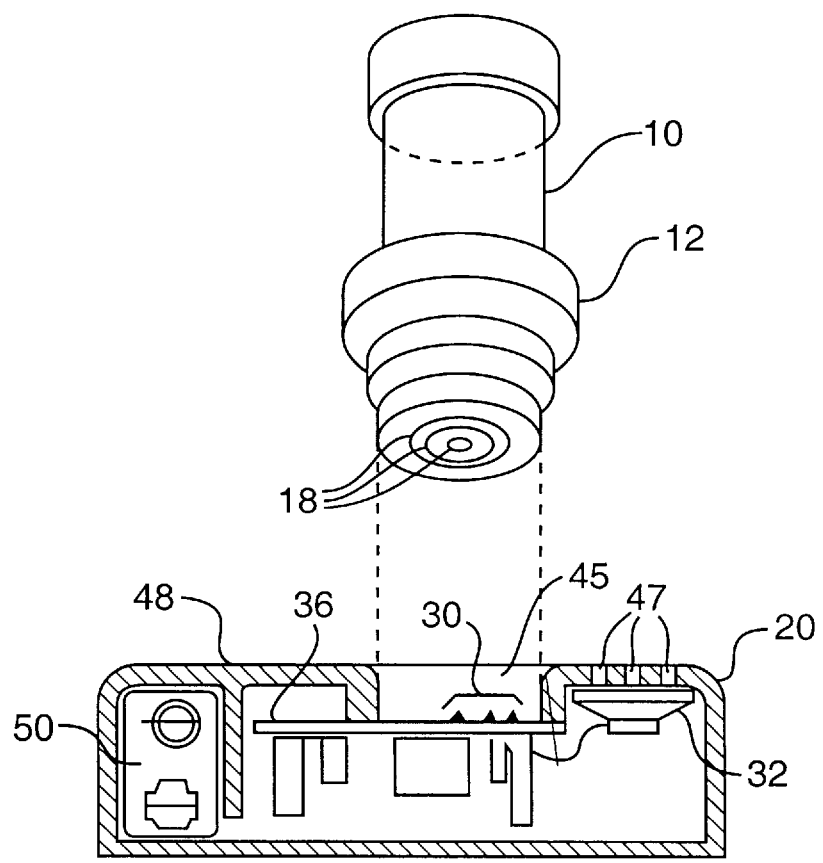
FIG. 3 is an exploded view showing the juxtaposition of parts in the playback unit.

The pill bottle 10 together with the information stored in the memory unit is delivered to the user and transported to the place where the medication is to be stored such as at the work place or home where the playback unit 20 is located. The playback unit 20 may be relatively small, battery powered or cord powered and easily transported. When the pill bottle 10 is inserted in the recess 45 on the upper surface 48, the concentric rings 18 engage the three contacts 30 carried on a circuit board as is also illustrated in FIG. 3. The playback unit 20 also includes a loud speaker 32, a 9 volt battery 50 and circuitry as illustrated by the block diagram to enable the information contained in the memory unit 11 to be played as an audible speech signal through housing holes 47 to confirm orally what is printed on the label.

Figure 5:
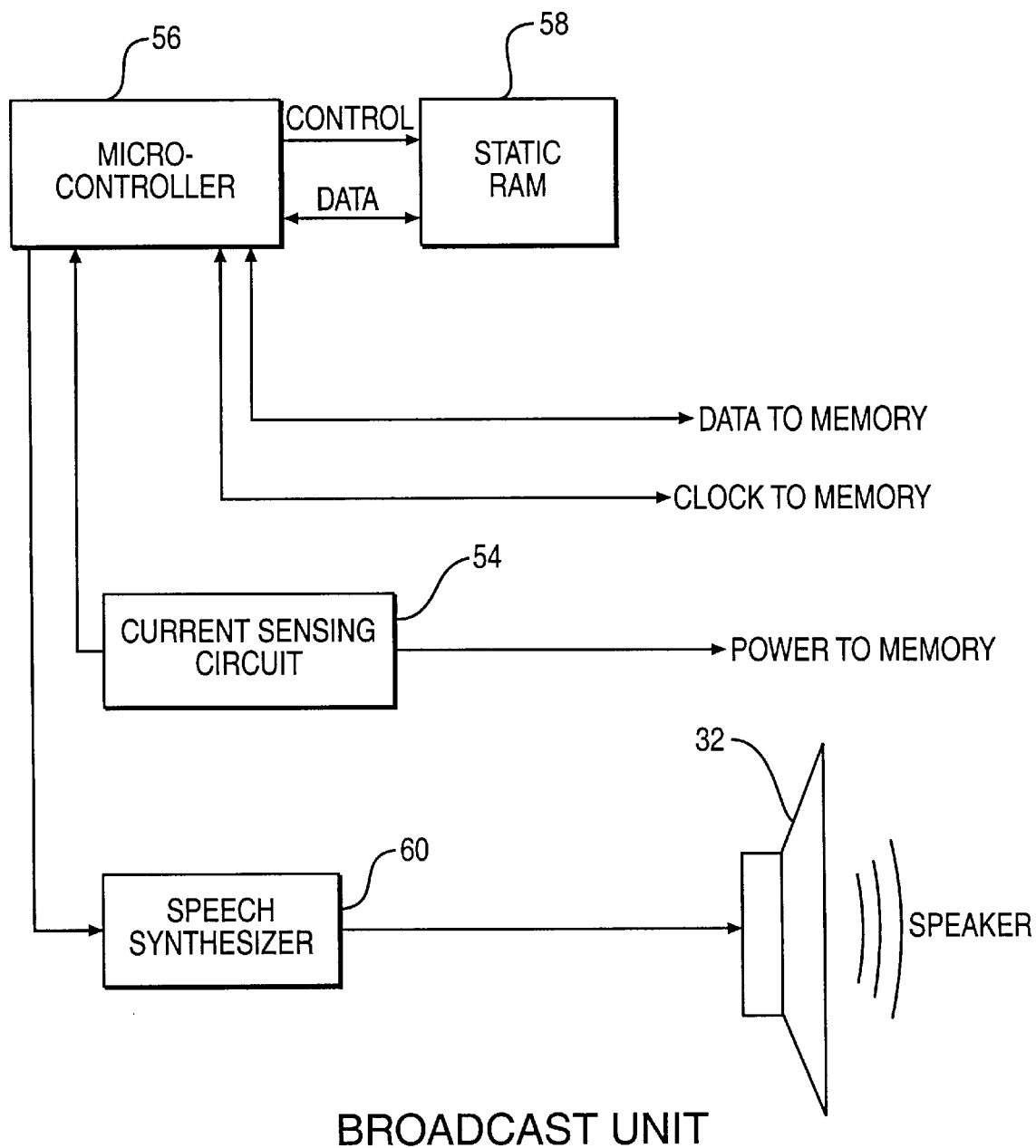
FIG. 5 is a block diagram of the electronics that may be used in the broadcast unit.

With reference to FIG. 5, when the housing 12 is inserted in the recess of the upper surface 48 of the playback unit 20, a current sensing circuit 54 alerts the microcontroller 56 that a medication container 10 is in place. Data is transferred from the memory unit 11 accompanying the medication container 10 to the static RAM 58 via microcontroller 56. A tone is generated to let the user know that the container 10 can be removed from the recess in the playback unit 20. The microcontroller transfers the data from the static RAM 58 to the speech synthesizer 60 and a message is heard through the loud speaker 32. To replay the message, the memory unit 11 on the container 10 is reinserted In contrast to other methods concerning the safeguarding of administered drugs, this system eliminates the cost and complexity of having battery, power supply, speaker and associated circuitry contained in the pill bottle assembly. It can be seen that in homes where a plurality of prescription drugs are taken daily, the present invention has a quantum cost advantage over other known methods.

While certain embodiments of the invention have been described and illustrated, other variations and changes may be made without departing from the spirit of the invention. Such variations, changes and equivalents as fall within the scope of the appended claims are intended to be covered thereby.

What is claimed is:

1. Apparatus for identifying medication within a container with audible speech produced at the demand of a user comprising:

a playback unit at the place where the user stores medication, said playback unit including a loud speaker and circuitry for producing speech sounds identifying contents within a medication container in response to placing the medication container in operative association with the playback unit;

b. said medication container having a memory unit with external electrical contacts adapted for operative engagement with the circuitry of said playback unit; and c. a programming unit at a pharmacy station having electrical terminals adapted for operative engagement with the terminals on said medication container for transferring at least medication identification and other related information into the memory unit of said container.

2. In a system for dispensing medication which has data processing equipment at a pharmacy station, said processing equipment being adapted to produce a printed label for a container identifying the contained medication and other selected messages at least in part from said pharmacy station data processing equipment, a. a memory unit provided as part of the medication container;

b. a programming unit at the pharmacy station which is connected to be part of said pharmacy station data processing equipment and adapted to interface with said memory unit for entering into the memory unit information at least identifying the contained medication as well as such other information as may be deemed desirable; and c. a playback unit at a medication user location which is adapted to interface with said container memory unit, said playback unit having a loud speaker capable of generating speech sounds based on information stored in said memory unit on request of a user.

3. The system of claim 2 wherein the memory unit is mounted in a housing having an opening at one end sized to fit with the medication container and be connected through a housing wall to electrical connectors on an outer housing wall;

a. said programming unit has electrical contacts positioned to mate with said housing contacts thereby to enable recording of stored information relating to medication within the container; and b. said playback unit has electrical contacts positioned to mate with said housing contacts thereby to enable playback of said stored information.

4. The system of claim 3 wherein the contacts of the housing are in the form of spaced concentric circles and the contacts in the programming and playback units are a point type to allow easy positioning of the housing in the programming and playback units.

5. The system of claim 2 wherein the memory unit is mounted in a separate housing having an opening with different stepped diameters thereby accommodating containers having different diameters.

6. The system of claim 2 wherein the memory unit is formed as an integral part of a synthetic resin pill bottle and is connected to electrical terminals in the form of three concentric circular conductors that are mounted on a planar surface.

7. A method of generating audible speech sounds related to identification of medication in its container whereby reading or sight impaired persons can audibly receive information identifying the medication and selected messages as are found on a printed label on the same container, said method comprising:

a. providing a memory unit in a housing incorporated as part of said container;

b. providing at a pharmacy station a programming unit adapted to operably supply to said memory unit said medication identifying and selected message information;

c. recording in said memory unit at least part of said information that is correlated with the medication in said container and generated locally at the pharmacy station for the container label;

d. delivering to a user said medication in said container with said housing and the memory unit containing said medication correlated information;

e. providing for the user a playback unit which includes a loud speaker and apparatus for reading out information stored in said memory unit; and f. placing the container and attached housing together with the playback unit to cause said loud speaker to produce a speech signal based on at least part of the medication correlated information stored in said memory unit.

8. The method of claim 7 wherein the housing has an open top end that is sized to frictionally engage a bottom end of a medication container and a protruding bottom end;

a. the programming unit has an open upper end; and b. recording is effected by a step including inserting the container bottom end into the upper end of the programming unit.

9. The method of claim 8 wherein the housing has an open top end that is sized to frictionally engage a bottom end of a medication container and a protruding bottom end;

a. the playback unit has an upper open end; and b. the audible voice signal is produced in response to inserting the container bottom end into the upper open end of the playback unit.

10. The method of claim 7 wherein the container has at a bottom end opposite a closure cap at least three electrical terminals that are connected to said memory unit;

a. the programming unit and the playback unit both have three electrical terminals which are positioned on upwardly facing surfaces of the respective units and sized to engage the container electrical terminals; and b. the steps of recording and playing back information into and from said memory unit are by inserting the lower end of the container into the programming and playback units respectively to engage the respective contacts.

* * * * *